United States Patent [19]

Tichy

[11] Patent Number: 5,514,927
[45] Date of Patent: May 7, 1996

[54] PIEZOELECTRIC AUDIO TRANSDUCER

[75] Inventor: Thomas H. Tichy, Albuquerque, N.M.

[73] Assignee: Motorola, Inc., Schaumburg, Ill.

[21] Appl. No.: 203,469

[22] Filed: Feb. 28, 1994

[51] Int. Cl.[6] ................................................. H01L 41/08
[52] U.S. Cl. ..................... 310/330; 310/369; 310/322; 310/334
[58] Field of Search ........................ 310/330, 334, 310/322, 329, 369, 324

[56] References Cited

U.S. PATENT DOCUMENTS

| | | | |
|---|---|---|---|
| 2,045,404 | 6/1936 | Nicholides | 310/324 |
| 3,085,167 | 4/1963 | Kritz | 310/322 |
| 4,035,672 | 7/1977 | Beaverson et al. | 310/324 |
| 4,228,379 | 10/1980 | Guscott et al. | 310/322 |
| 4,430,529 | 2/1984 | Nakagawa et al. | 310/326 |
| 4,450,376 | 5/1984 | Meitzler | 310/334 |
| 5,009,106 | 4/1991 | Kubler et al. | 310/329 |
| 5,031,222 | 7/1991 | Takaya | 310/324 |
| 5,196,754 | 3/1993 | Berthold et al. | 310/324 |
| 5,235,237 | 8/1993 | Leonhardt | 310/329 |
| 5,264,822 | 11/1993 | Vogelman et al. | 340/286.01 |

FOREIGN PATENT DOCUMENTS 0174000  9/1985  Japan ................................. 310/324

*Primary Examiner*—Thomas M. Dougherty
*Attorney, Agent, or Firm*—Gary J. Cunningham; Timothy W. Markison

[57] ABSTRACT

A piezoelectric transducer (100) may be achieved by mounting a piezoelectric bender (101) within a housing (102). Maximum resonation may be obtained by mounting the piezoelectric bender (101) on a single post (103). The housing (102) is constructed to have essentially the same geometry as the piezoelectric bender (101) and is separated by a predetermined distance (104). This predetermined distance (104) provides an acoustic impedance such that sound may resonate from the transducer.

5 Claims, 2 Drawing Sheets

PIEZOELECTRIC AUDIO TRANSDUCER

FIELD OF THE INVENTION

This invention relates generally to transducers, and in particular, to transducers that include a piezoelectric bender.

BACKGROUND OF THE INVENTION

Piezoelectric audio transducers are known to comprise a piezoelectric bender and supporting structure. Typically, such a transducer has the piezoelectric bender attached to the housing in by the periphery of the bender to provide adequate acoustic impedance. With such a structure, the piezoelectric bender vibrates when it receives an electrical stimulus. This vibration creates a sound pressure within the housing such that the transducer renders the electrical stimulus into an audible signal. By having the piezoelectric bender attached to the housing by it's periphery, the amount of vibration is limited for a give size bender, which also limits the strength of the audible signals. To achieve desired audible signal levels, the piezoelectric bender area has to increase in size (in excess of 2.46 sq. cm), which limits its applicability in electronic devices that are striving for miniaturization (such devices need an audio transducer that is no more than 0.78' sq. cm).

One solution to the miniaturization problem is to use magnetic transducers. Magnetic transducers can meet both the size requirements and audible level requirements of miniaturized electronic devices. However, magnetic transducers have low impedance and, as such, draw a relatively large amount of current, which is a sacred commodity in miniaturized electronic devices such as cellular telephones or pagers.

Therefore, a need exists for a piezoelectric audio transducer that meets the size requirements of miniaturized electronic devices while not having the current drain problems of the prior art.

DESCRIPTION OF A PREFERRED EMBODIMENT

Generally, the present invention provides a audio piezoelectric transducer that includes a piezoelectric bender and a housing. The piezoelectric bender, having a predetermined geometry, is mounted within the housing in only one location, i.e., the piezoelectric bender has only one point of contact to the housing which allows for maximum displacement of the bender. The housing substantially encircles the bender and is separated by a predetermined distance to provide an acoustic impedance. With the acoustic impedance, mechanical vibrations of the bender is converted in to audible signals. Thus, the present invention allows the size of the piezoelectric bender to be minimized for use in miniaturized devices without the current drain problems of magnetic transducers.

Figure 1:
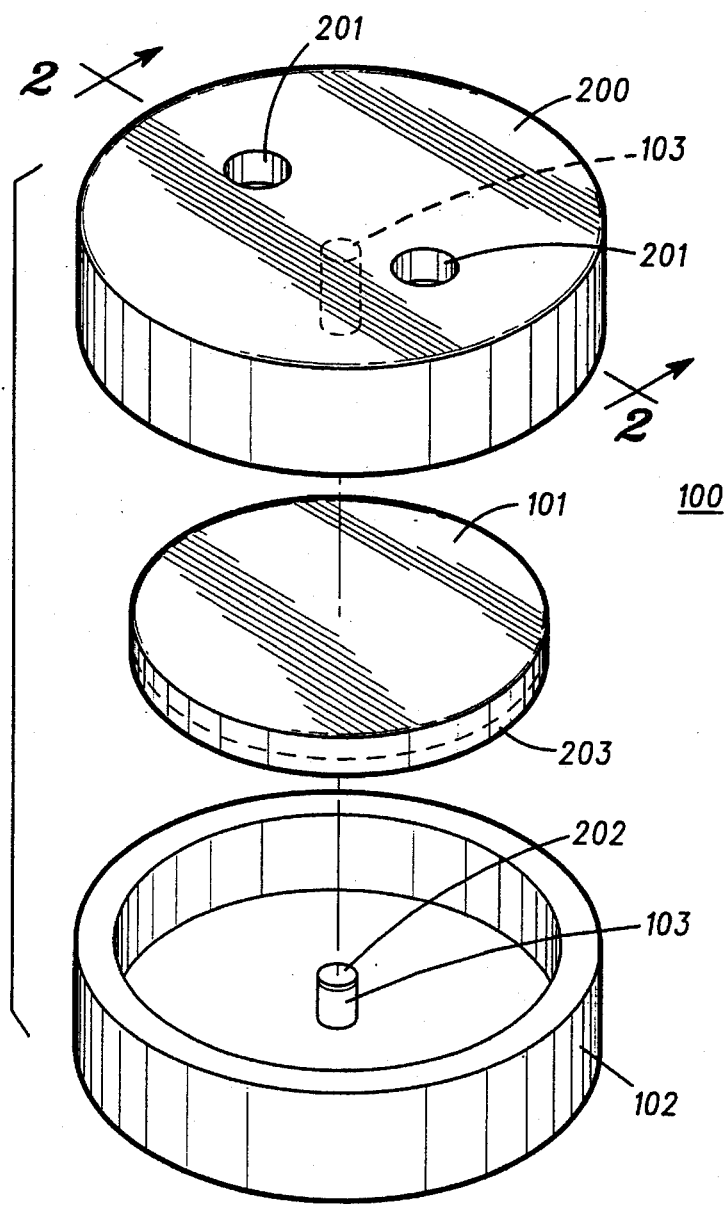
FIG. 1 illustrates an exploded view of a piezoelectric audio transducer in accordance with the present invention.

The present invention can be more fully described with reference to FIGS. 1–3. FIG. 1 illustrates a piezoelectric audio transducer (100) that includes a piezoelectric bender (101) and a housing (102). The piezoelectric bender (101) is mounted on a post (103) and is separated from the housing (102) by a predetermined distance (104). By centering the bender (101) on the post (103), a maximum mechanical vibration can be achieved, while minimizing mechanical loses, which allows the size of the bender (101) to be minimized. This predetermined distance (104) helps to derive the acoustic impedance for the transducer. The selection of the predetermined distance (104) must be such that it allows the periphery of the bender to vibrate but not exactly touch the surrounding housing. For example, the predetermined distance (104) may be in the range of 0.01 millimeters to 0.2 millimeter. If the predetermined distance (104) is too much, sound pressure produced on one side of the bender will cancel the sound pressure produced on the other side, thus rendering the transducer useless.

In the transducer (100), the piezoelectric bender (101) may be of either a bimorph or monomorph construction. When the bender (101) is of a monomorph construction, the housing (102) may be designed to provide electrical connections to the bender (101) without the need for lead wires or soldering. However, if the bimorph construction is used, which produces a theoretical 6 dB increase in output, the mechanical complexity increased because electrical connections need to be connected to the center of the bimorph. But in either case, the resulting transducer (100) has a very flat package, a 10 centimeter diameter piezoelectric bender, an area of 0.78 sq. cm, and producing outputs of 92 dB sound pressure levels (SPL) at a 3 volt RMS, 2500 Hz, drive.

Figure 2:
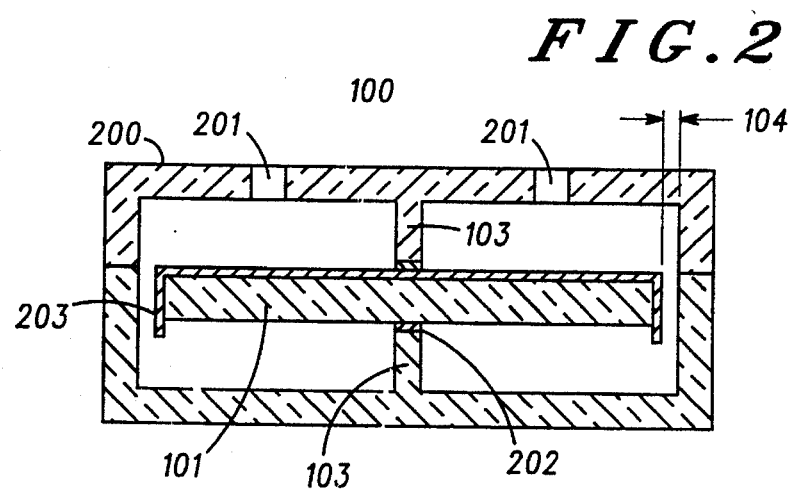
FIG. 2 illustrates a cross-sectional view of the piezoelectric audio transducer of FIG. 1.

FIG. 2 illustrates a cross-sectional view of the transducer (100). Shown is the piezoelectric bender (101), the post (103), a cover (200), acoustic shaping resonators (201), electrical contact (202) and a flange (203). The acoustical shaping resonators (201) provide a path for the sound to radiate from the transducer (100). Wherein the shapes are chosen to effect the desired sound, which is generally known in the art. The cover (200) also includes a post (103) which provides electrical contact (202) to the bender (101). In addition, the piezoelectric bender (101) may include a plating surface that extends into flanges (203). These flanges increase the acoustic impedance thus allowing the transducer to provide a greater sound pressure levels.

Figure 3:
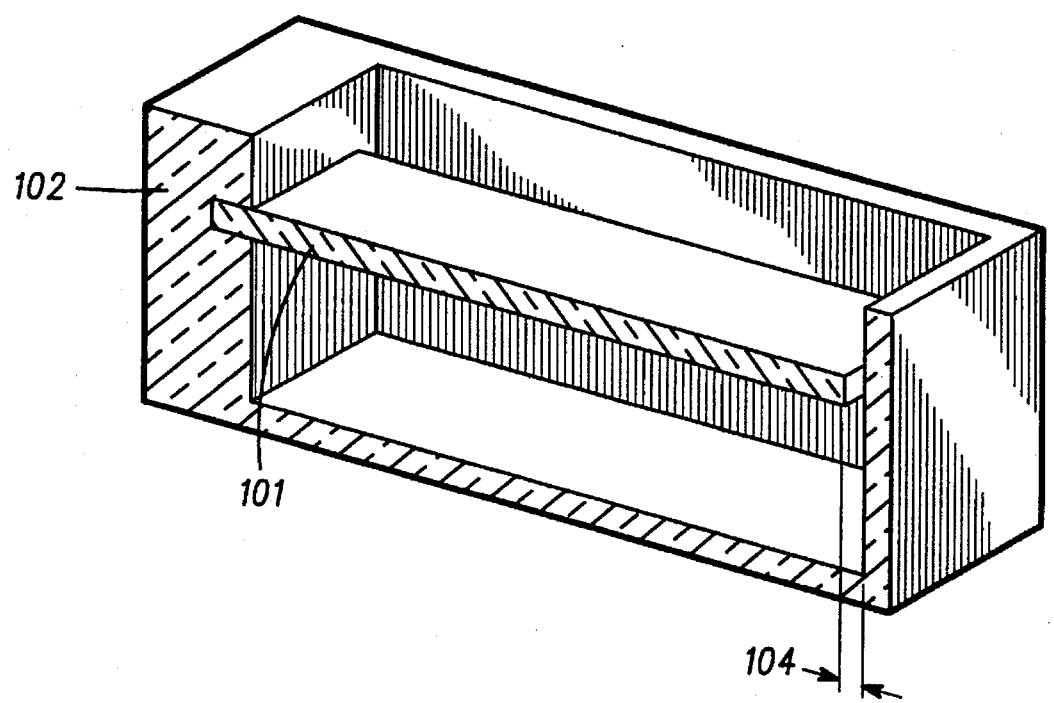
FIG. 3 illustrates an alternative embodiment of a piezoelectric audio transducer in accordance with the present invention.

FIG. 3 illustrates an alternative embodiment of the piezoelectric transducer (100). In this embodiment, the piezoelectric transducer (300) comprises a rectangular shape. The piezoelectric bender (101) also has a rectangular shape and is mounted at one end to the housing (102). Again, the predetermined distance (104) is provided to account for the acoustic impedance.

The transducer (100), because of its small size, has a multitude of applications. For example, the transducer (100) may be included in a cellular telephone that includes a transmitter, a receiver, and a communication processor. As a further example, the transducer (100) may be included in a pager that includes a receiver and a communication processor.

The present invention provides a piezoelectric transducer having a piezoelectric bender mounted in only one location. With such an apparatus, the present invention allows the size of piezoelectric transducers to be miniaturized; for example, such a transducer will have a volume of 0.246 cubic cm. In addition, the current drain of a transducer in accordance with the present invention is considerably less that the current drain of prior an magnetic transducers.

I claim:

1. A transducer comprising:

a miniature piezoelectric bender having a substantially circular geometry and a conductive surface including a flange extending downwardly at substantially the entire outer periphery thereof; and a housing having at least one port defining an acoustic shaping resonator, the housing being mechanically coupled to the miniature piezoelectric bender by only posts contacting a substantially central location of the miniature piezoelectric bender, and having a housing geometry that is substantially complementarily configured to receive substantially only the miniature piezoelectric bender, the housing is separated from the outer periphery of the flange by a predetermined distance to provide a substantial acoustic impedance, the predetermined distance is sufficiently large to allow the periphery of the miniature piezoelectric bender to vibrate substantially without touching the housing and sufficiently small so as to minimize the sound pressure produced on one side of the piezoelectric bender from cancelling the sound pressure produced on the other side, whereby the acoustic impedance is such that mechanical vibrations of the miniature piezoelectric bender are converted to audible signals emanating through the acoustic shaping resonator.

2. In the transducer of claim 1, the piezoelectric bender is comprised of a monomorph construction.

3. In the transducer of claim 1, the piezoelectric bender is comprised of a bimorph construction.

4. A cellular telephone that includes transmitter, receiver, a communication processor, and a transducer, wherein the transducer comprises:

a miniature piezoelectric bender having a substantially circular geometry and a conductive surface including a flange extending downwardly at substantially the entire outer periphery thereof; and a housing having at least one port defining an acoustic shaping resonator, the housing being mechanically coupled to the miniature piezoelectric bender by only posts contacting a substantially central location of the miniature piezoelectric bender, and having a housing geometry that is substantially complementarily configured to receive substantially only the miniature piezoelectric bender, the housing is separated from the outer periphery of the flange by a predetermined distance to provide a substantial acoustic impedance, the predetermined distance is sufficiently large to allow the periphery of the miniature piezoelectric bender to vibrate substantially without touching the housing and sufficiently small so as to minimize the sound pressure produced on one side of the piezoelectric bender from cancelling the sound pressure produced on the other side, whereby the acoustic impedance is such that mechanical vibrations of the miniature piezoelectric bender are converted to audible signals emanating through the acoustic shaping resonator.

5. A pager that includes a receiver, a communication processor, and a transducer, wherein the transducer comprises:

a miniature piezoelectric bender having a substantially circular geometry and a conductive surface including a flange extending downwardly at substantially the entire outer periphery thereof; and a housing having at least one port defining an acoustic shaping resonator, the housing being mechanically coupled to the miniature piezoelectric bender by only posts contacting a substantially central location of the miniature piezoelectric bender, and having a housing geometry that is substantially complementarily configured to receive substantially only the miniature piezoelectric bender, the housing is separated from the outer periphery of the flange by a predetermined distance to provide a substantial acoustic impedance, the predetermined distance is sufficiently large to allow the periphery of the miniature piezoelectric bender to vibrate substantially without touching the housing and sufficiently small so as to minimize the sound pressure produced on one side of the piezoelectric bender from cancelling the sound pressure produced on the other side, whereby the acoustic impedance is such that mechanical vibrations of the miniature piezoelectric bender are converted to audible signals emanating through the acoustic shaping resonator.

* * * * *